United States Patent
Lehmann et al.

(10) Patent No.: US 9,000,349 B1
(45) Date of Patent: Apr. 7, 2015

(54) SENSE NODE CAPACITIVE STRUCTURE FOR TIME OF FLIGHT SENSOR

(75) Inventors: Michael Lehmann, Winterthur (CH); Bernhard Buettgen, Adliswill (CH); Jonas Felber, Niederbipp (CH)

(73) Assignee: MESA Imaging AG, Zurich (CH)

( * ) Notice: Subject to any disclaimer, the term of this patent is extended or adjusted under 35 U.S.C. 154(b) by 137 days.

(21) Appl. No.: 12/837,853

(22) Filed: Jul. 16, 2010

Related U.S. Application Data

(60) Provisional application No. 61/230,357, filed on Jul. 31, 2009.

(51) Int. Cl.
H01L 27/146 (2006.01)
H01L 31/02 (2006.01)

(52) U.S. Cl.
CPC .... H01L 27/14614 (2013.01); H01L 31/02005 (2013.01); H01L 27/14616 (2013.01)

(58) Field of Classification Search
CPC ............... H01L 27/14612; H01L 27/14614; H01L 27/14616; H01L 31/02005; G01S 7/4863; H04N 5/369
USPC ............... 250/208.1; 348/294, 308, 311, 316, 348/319; 257/231, 225
See application file for complete search history.

(56) References Cited

U.S. PATENT DOCUMENTS

| | | | |
|---|---|---|---|
| 4,228,365 A * | 10/1980 | Gutierrez et al. | 377/63 |
| 5,856,667 A | 1/1999 | Spirig et al. | |
| 7,012,248 B2 * | 3/2006 | Paschalidis | 250/287 |
| 7,586,077 B2 * | 9/2009 | Lehmann et al. | 250/208.1 |
| 7,889,257 B2 * | 2/2011 | Oggier et al. | 348/308 |
| 8,223,215 B2 * | 7/2012 | Oggier et al. | 348/222.1 |
| 2005/0281369 A1 * | 12/2005 | Kushner et al. | 377/62 |
| 2008/0239466 A1 | 10/2008 | Buettgen | |
| 2009/0020687 A1 * | 1/2009 | Lehmann et al. | 250/208.1 |
| 2009/0021617 A1 * | 1/2009 | Oggier et al. | 348/294 |
| 2009/0190007 A1 * | 7/2009 | Oggier et al. | 348/241 |
| 2010/0053405 A1 * | 3/2010 | Lehmann et al. | 348/311 |
| 2010/0308209 A1 * | 12/2010 | Buettgen et al. | 250/208.1 |
| 2011/0037969 A1 * | 2/2011 | Spickermann et al. | 356/5.01 |
| 2011/0114821 A1 * | 5/2011 | Felber et al. | 250/208.1 |

(Continued)

FOREIGN PATENT DOCUMENTS

| | | |
|---|---|---|
| DE | 19704496 A1 | 3/1998 |
| EP | 1624490 A1 | 2/2006 |

(Continued)

OTHER PUBLICATIONS

Ay, S., "A Hybrid CMOS APS Pixel for Wide-Dynamic Range Imaging Applications", IEEE International Symposium on Circuits and Systems, May 2008, pp. 1628-1631.

(Continued)

Primary Examiner — John Lee
(74) Attorney, Agent, or Firm — Fish & Richardson P.C.

(57) ABSTRACT

An increased sense node capacitance, mainly for 3D time-of-flight (TOF) applications, includes a storage structure that combines the advantages of gate and diffusion capacitance in order to improve the overall capacitance. The storage structure provides higher capacitance per unit area and accordingly a better fill-factor/sensitivity of the pixel; improved noise behaviour because of the use of gate capacitances, better protection against interacting signals and thus better signal quality.

9 Claims, 4 Drawing Sheets

(56) References Cited

U.S. PATENT DOCUMENTS

2011/0273561 A1* 11/2011 Oggier et al. ............ 348/135
2012/0033045 A1* 2/2012 Schweizer et al. ........ 348/46
2012/0098964 A1* 4/2012 Oggier et al. ............ 348/140

FOREIGN PATENT DOCUMENTS

| GB | 2389960 A | 12/2003 |
|---|---|---|
| WO | 2006/012761 A1 | 2/2006 |
| WO | 2007/045108 A1 | 4/2007 |
| WO | 2010/025331 A1 | 3/2010 |

OTHER PUBLICATIONS

Buettgen, B., et al., "CDD/CMOS Lock-In Pixel for Range Imaging: Challenges, Limitations and State-of-the-Art", 1st Range Imaging Days, ETH Zurich, 2005, 12 pages.

Buettgen, B., et al., "Demodultion Pixel Based on Static Drift Fields", IEEE Transactions on Electron Devices, Nov. 2006, pp. 2741-2747, vol. 53, No. 11.

Buettgen, B., et al., "Demonstration of a Novel Drift Field Pixel Structure for the Demodulation of Modulated Light Waves with Application in Three-Dimensional Image Capture", Proceedings of the SPIE, Apr. 1, 2004, pp. 9-20, vol. 5302, SPIE, Bellingham, VA.

Buettgen, B., "Extending Time-of-Flight Optical 3D-Imaging to Extreme Operating Conditions", Ph.D. Thesis, University of Neuchatel, 2006.

Gokturk, S.B., et al., "A Time-Of-Flight Depth Sensor—System Description, Issues and Solutions", CVPR 04, vol. 3, p. 35, (2004).

Hagebeuker, B., "Mehrdimensionale Objekterfassung mittles PMD Sensorik", ("Multi-Dimensional Object Detection Medium PMD Sensor"), Optik & Photonik, Mar. 2008, 3 pages.

Kawahito, S., et al., "A CMOS Time-of-Flight Range Image Sensor with Gates-on-Field-Oxide Structure", IEEE Sensors Journal, Dec. 2007, pp. 1578-1586, vol. 7, No. 12.

Lange, R., et al., "Time-of-flight range imaging with a custom solid-state image sensor", Laser Metrology and Inspection, Proc. SPIE, 1999, vol. 3823, Munich.

Moeller, T., et al., "Robust 3D Measurement with PMD Sensors", 1st Range Imaging Research Day, ETH Zurich, 2005.

Oggier, T., et al., "An all-solid-state optical range camera for 3D real-time imaging with sub-centimeter depth resolution (SwissRanger TM)", Optical Design and Engineering, Proceedings of the SPIE, 2004, pp. 534-545, vol. 5249.

Schwarte, R., et al., "A new electrooptical mixing and correlating sensor: Facilities and Applications of the Photonic Mixer Device (PMD)", Proc. SPIE, Sep. 1997, pp. 245-253, vol. 3100.

Spirig, T., et al., "The Lock-In CCCD—Two-Dimensional Synchronous Detection of Light", IEEE Journal of Quantum Electronics, Sep. 1995, pp. 1705-1708, vol. 31, No. 9.

Ushinaga, T., et al., "A QVGA-size CMOS Time-of-Flight Range Image Sensors With Background Light Charge Draining Structure", Three-Dimensional Image Capture and Applications VII, Proceedings of SPIE, Jan. 2006, pp. 34-41, vol. 6056.

Van Nieuwenhove, D., et al., "Novel Standard CMOS Detector using Majority Current for guiding Photo-Generated Electrons towards Detecting Junctions", Proceedings Symposium IEEE/LEOS Benelux Chapter, 2005.

* cited by examiner

SENSE NODE CAPACITIVE STRUCTURE FOR TIME OF FLIGHT SENSOR

RELATED APPLICATIONS

This application claims the benefit under 35 USC 119(e) of U.S. Provisional Application No. 61/230,357, filed on Jul. 31, 2009 which is incorporated herein by reference in its entirety.

BACKGROUND OF THE INVENTION

Three dimensional (3D) time-of-flight (TOF) cameras are capable of getting depth information for all pixels in a two dimensional array in real-time.

The distance resolution of TOF cameras is, among other factors, limited by the number of electrons which can be stored in the pixel. 2D-cameras are designed such that their pixels can store enough charge carriers to reach the desired signal-to-noise ratio. 3D-TOF imagers also need to store enough electrons that are generated by the modulated illumination in order to achieve a minimum distance measurement resolution. In addition, the imagers have to cope with electrons generated by any background light.

TOF pixels, as presented in [MOE05A], [KAW06A], [GOK04A], [NIE05A], use a diffusion capacitance for electron storage, the so-called sense node. The maximum possible number of electrons in the sense node depends on the size of the sense node and the capacitance per unit area. This means, for a large optical fill factor and high sensitivity of the pixel, the capacitance per unit area must be as high as possible. However, the capacitance for a diffusion node is determined by the technology parameters and cannot be increased further by the chip designer.

The demodulation of modulated light signals accomplished already at pixel level requires, in all approaches known today, the switching of a photo-generated current. It is possible to handle both electron as well as hole currents, but the common methods make use of the photo-generated electrons due to their higher mobility in the semiconductor material. Some pixel architectures do the necessary signal processing based on the photo-current and other architectures work in the charge domain directly.

Common to all pixels is the necessary transfer of charges through the photo-sensitive detection region to a subsequent storage area or to a subsequent processing unit. In the case of charge domain-based pixel architectures, the photo-charge is generally transferred to a storage node. In order to demodulate an optical signal, the pixel has to have implemented at least two integration nodes that are accumulating the photo-generated charges during certain time intervals. Another minimum requirement would be the implementation of at least one integration node and having at least one other node for dumping charge carriers as well.

Different pixel concepts have been realized in the last few decades. Spirig [SPI95B] and later Schwarte [SCH98A] introduced a demodulation pixel, which transfers the photo-generated charge below a certain number of adjacent poly-silicon gates to discrete accumulation areas. Spirig [SPI99A] disclosed a CCD lock-in concept that allows the in-pixel sampling of the impinging light signal with theoretically an arbitrary number of samples. First cameras based on this lock-in pixel concept have been demonstrated by Lange [LAN99A] and Oggier [Ogg03A]. Another similar pixel concept has been demonstrated by Kawahito [KAW06A], [KAW07A], where a thick field-oxide layer is used to smear the potential distribution below the demodulation gates.

New concepts for pixels have been explored in the last years that involve accelerating the in-pixel transport of the charges by exploiting lateral electric drift fields. Seitz [SEI02A] invented the first drift field demodulation device that is based on a very high-resistivity polysilicon gate electrode. It even allows very easy design of pixels that implement an arbitrary number of samples. The concept was proven by Buettgen [BUE05B], who disclosed later another concept of demodulation pixels. The static drift field pixel [BUE04B] [BUE05A], in contrast to the architectures mentioned before, clearly separates the detection and the demodulation regions within the pixel. Another pixel concept was proven by Nieuwenhoven [NIE05A], in which the lateral electric drift field is generated by the current of majority carriers within the semiconductor substrate. Minority carriers are generated by the photons and transported to the particular side of the pixel just depending on the applied drift field.

All of the above concepts must be able to store a large number of charge carriers within the pixel itself in order to reach a high signal quality, and therefore all of them depend on an efficient storage structure. This means the more electrons can be stored in the pixel, the better the distance resolution, or in the case of background (BG) light-dominated scenes, the better the BG suppression.

The trend of 3D imaging pixels is going in the direction of integrating n>=3 storage nodes per pixel. This, however, claims not only more space for the n-storage-gates, but also requires an integration of m<=n source followers, m select transistors, and m reset transistors in every pixel. The problem here is that the pixel's optical fill factor gets smaller when integrating a larger number of storage nodes and output paths, which, in turn, decreases significantly the sensitivity of the pixel.

In most state-of-the-art pixels the charge is stored in diffusion capacitances in the so-called sense nodes. However, the diffusion capacitance is rather small compared to other capacitance types and claims more space for a given amount of electrons. In 3D TOF pixels, the area spent for storing electrons is one of the most area-consuming parts in the pixel. In order to increase the pixel performance, especially in multi-tap pixels, new storage structures must be found.

Furthermore, diffusion in the sense node is affected by interface defects, which increase the noise level while storing the charge therein. In contrast, gate capacitances allow a more efficient, noise-reduced storage, but they have the disadvantage that the charge under the gate cannot be tapped.

SUMMARY OF THE INVENTION

Both capacitances have particular advantages and drawbacks. The presented structure herein shows a solution which combines the advantages of both types in order to increase the overall capacitance.

In general, according to one aspect, the invention features, a pixel comprising: a photosensitive area that converts light into photogenerated charges and a storage structure comprising an integration gate and a diffusion capacitance that stores the photogenerated charges.

In embodiments, the diffusion capacitance is a floating n+ diffusion region and functions as a sense node. An amplifier is provided for the readout of the photogenerated charges in the storage structure via the sense node.

Preferably, at least two of the storage structures are provided with each comprising an integration gate and a diffusion capacitance that store the photogenerated charges. The photogenerated charges are alternately stored in the storage structures synchronously with illuminating light.

The storage structure provides a few advantages. The overall capacitance is higher. This means, a higher number of charge carriers can be stored in the integration gate because of the higher capacitance per unit area of the storage gate capacitance, or the size of the integration gate can be reduced for the same amount of stored electrons. The noise level is lower. Most noise, generated during the storage phase, is caused by interface defects in the diffusion capacitance. The structure provides the possibility to minimize the sense node diffusion area, so that the noise caused by interface traps becomes negligible. The gate/diffusion capacitance is more robust against interfering signals. The constant voltage on the storage gate shields and protects the floating diffusion area from interacting signals. For example, it is conceivable that the floating sense node could be surrounded by the storage gate and therefore protected against in-coupling of neighboring signals.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

All following descriptions concerning the semiconductor materials are based on p-type silicon substrate. However, it is also possible to use n-doped silicon so that all doping relationships are swapped accordingly; the description herein is not to be understood as a limitation for using just p-doped semiconductor substrates. The same is meant for the photocurrents, which can either be electron or hole currents depending on the type of doping of the semiconductor material.

The presented idea uses a combination of gate and diffusion node capacitances to store the electrons in the pixel. The new storage structure profits from the gate's higher capacitance per unit area while still allowing the charge stored in the structure to be connected to the following read-out circuitry. This allows a higher overall capacitance to be achieved.

A related structure is described in [SUA08A] where a diffusion/gate combination is used to extend the dynamic range of a CMOS-pixel. However, the aim and the functionality of this structure are different. The pixel described therein stores the charge mainly in the diffusion capacitance. Only in the case of an overflow is the gate structure used to extend the integration capacity, and thus increase the dynamic range. With this step, [SUA08A] generates a second gradient in the light response curve. In contrast to the described wide-dynamic-range TOF pixel, the structure presented here is a pure charge-storage device with the main objective to aim to store as many electrons as possible on as little area as possible. It must be pointed out that in the embodiments presented herein the charge is not stored in the sensitive area of the TOF pixel, the signal charge is shifted to a covered, opaque storage area outside of the sensitive area. The structure is further optimized to increase the overall capacity.

Figure 1:
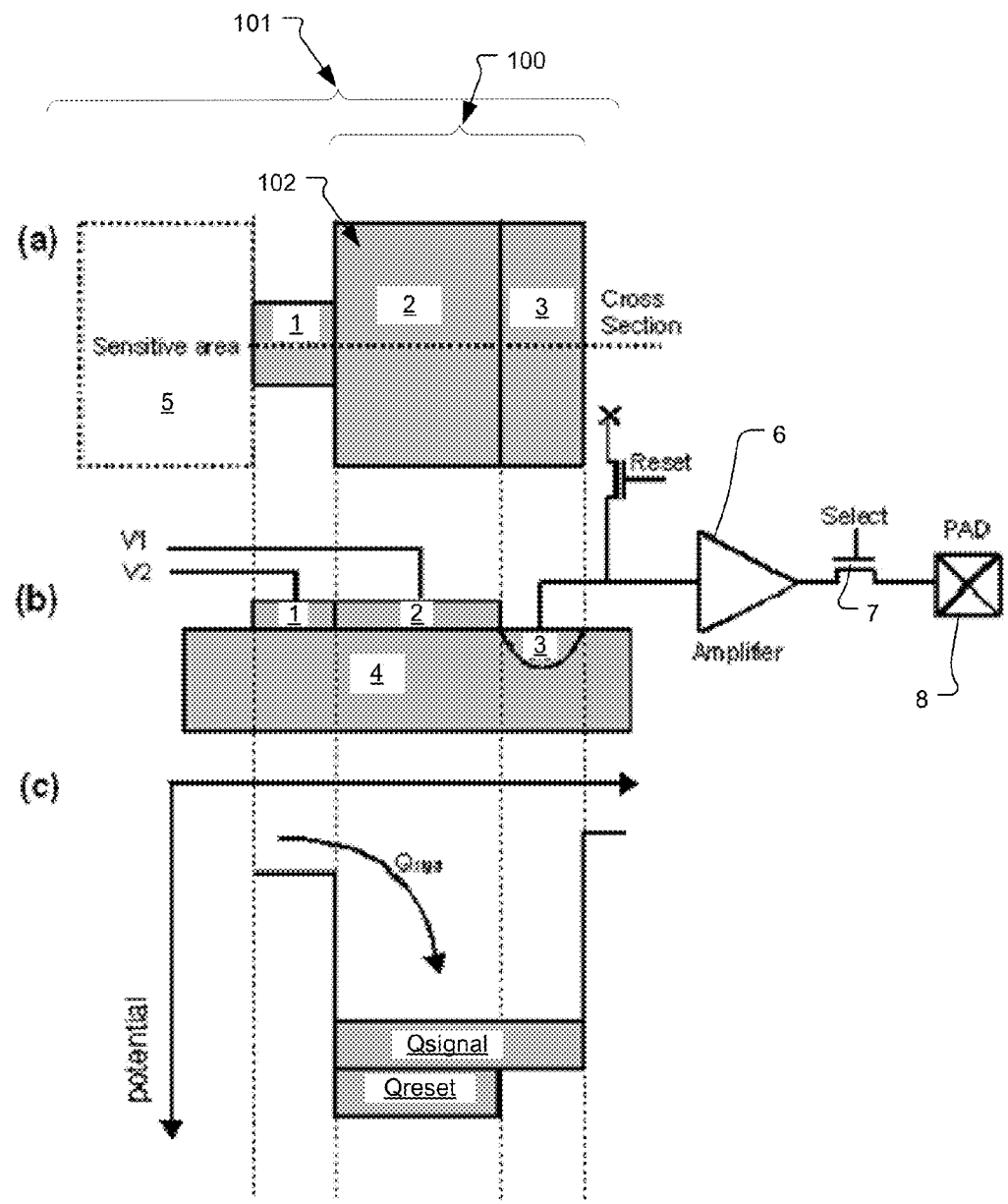
FIG. 1, portion (a) shows a storage structure with barrier gate, storage gate and sense node in a pixel, portion (b) shows a cross-section of the storage structure with reset transistor, select transistor, amplifier and PAD, and portion (c) shows the potential distribution of the storage structure in the semiconductor substrate during the charge integration.

FIG. 1 shows the basic implementation of the gate/diffusion charge-storage structure 100 of a pixel 101. In FIG. 1, portion (a) is a top view, (b) is a cross-section, and (c) shows the potential distribution over the structure 100.

The barrier gate 1 separates the charge from the previous stage, which in most cases is the sensitive area 5 of the pixel 101, and the gate/diffusion charge-storage structure 100. In the case of a 3D TOF pixel, the barrier gate 1 is usually part of the demodulation region and is then modulated up to a few GHz. Implementations with an additional integration gate, as described in [BUE05A], [BUE05B] and the U.S. Patent Application Publication No. US 2010/0053405 A1, are also possible. Instead of storing the full charge in the sense node, as in common 3D imagers, the main part of the charge is now stored under the storage gate. The sense node is just used as a tap.

The barrier gate 1 and the storage gate 2 keep the charge stored under the gates in region 4 of the wafer substrate that does not receive light as is the case with the sensitive region 5. The sense node 3 is a floating n+ diffusion region only connected to the reset circuit and the output or readout path through amplifier 6, select switch 7 and pad 8.

During the reset phase, the voltage V1 has to generate a potential in the substrate 4 beneath the integration gate 2 which is higher than the potential below the sense node 3 generated by shorting the sense node 3 to the reset level. If the sense node 3 is shorted to the reset voltage, the potential under the integration gate is filled up to the reset level (Qreset). Before starting to integrate charge carriers in the gate/diffusion charge-storage structure, the reset node needs to be released. A high voltage (V2) applied to the barrier gate 2 enables then charge flow from the pixel's sensitive area 5, over the open barrier gate 1 (V2 high), into the gate/diffusion charge-storage structure 2/3. As shown in (c) the potential generated by the storage gate voltage (V1) is higher than the one generated by the sense node's reset voltage. The occurred dip beneath the integration gate 2 is filled up to the reset voltage potential with electrons (Qreset) from the reset node.

The implementation of the presented structure is preferably processed in a technology that provides overlapping gates (charge coupled device (CCD) option) and a high integration density as in complementary metal oxide semiconductor (CMOS) processes. These types of CCD/CMOS-processes find their field of application mainly in 3D time-of-flight imagers.

CCD-imagers have their sense node in most cases at the end of each line and are therefore less limited in space than TOF imagers. This limitation will not prove to be a restriction to CCD/CMOS hybrid processes, but an implementation in pure CCD or CMOS processes is also possible.

A few possible embodiments of the gate/diffusion charge-storage structure (integration gate) 100 are discussed below, where the focus is set on 3D imaging pixels. However, it does not mean that these are all the possible pixel designs based on the structure disclosed herein. We emphasize herewith, that these examples do not restrict the concept from other design approaches.

The following embodiments show: The barrier gate 1, which receives charge carries from a photosensitive region(s) as described above, the storage gate 2, and the sense node (n+ diffusion) 3.

Figure 2:
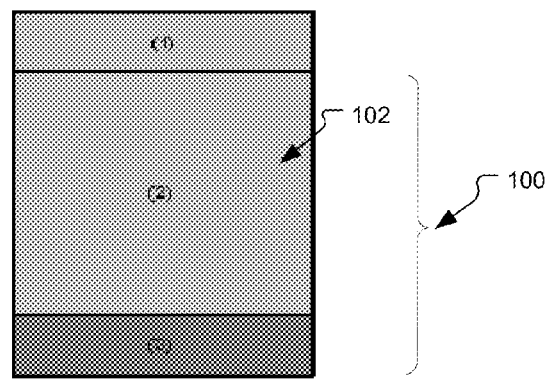
FIG. 2 is a top plan view showing a gate/diffusion charge-storage structure with an enlarged integration gate designed as stripe.

FIG. 2 shows a gate/diffusion charge-storage structure 100 with an enlarged integration gate 2 designed as stripe.

Figure 3:
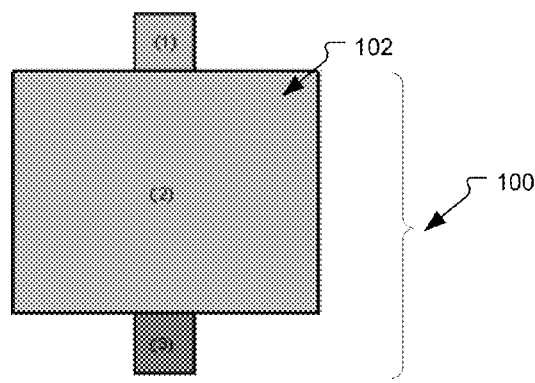
FIG. 3 is a top plan view showing a gate/diffusion charge-storage structure with an enlarged integration gate with small barrier gate and sense node.

FIG. 3 shows a gate/diffusion charge-storage structure 100 with an enlarged integration gate 2 with small barrier gate 1 and sense node 3.

Figure 4:
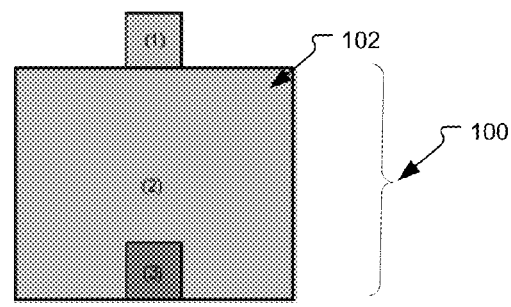
FIG. 4 is a top plan view showing a gate/diffusion charge-storage structure with an enlarged integration gate with embedded sense node.

FIG. 4 shows a gate/diffusion charge-storage structure 100 with an enlarged integration gate 2 with embedded sense node 3.

Figure 5:
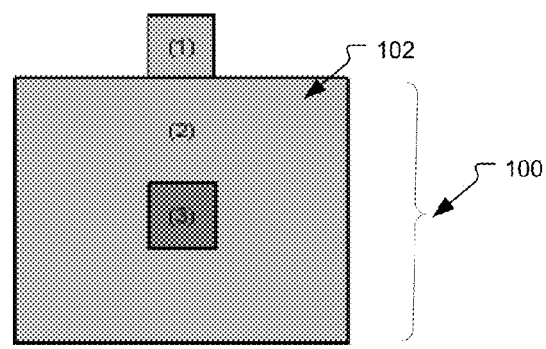
FIG. 5 is a top plan view showing a gate/diffusion charge-storage structure with an enlarged integration gate with sense node and tap in its middle.

FIG. 5 shows a gate/diffusion charge-storage structure 100 with an enlarged integration gate 2 with sense node 3 in its middle.

Figure 6:
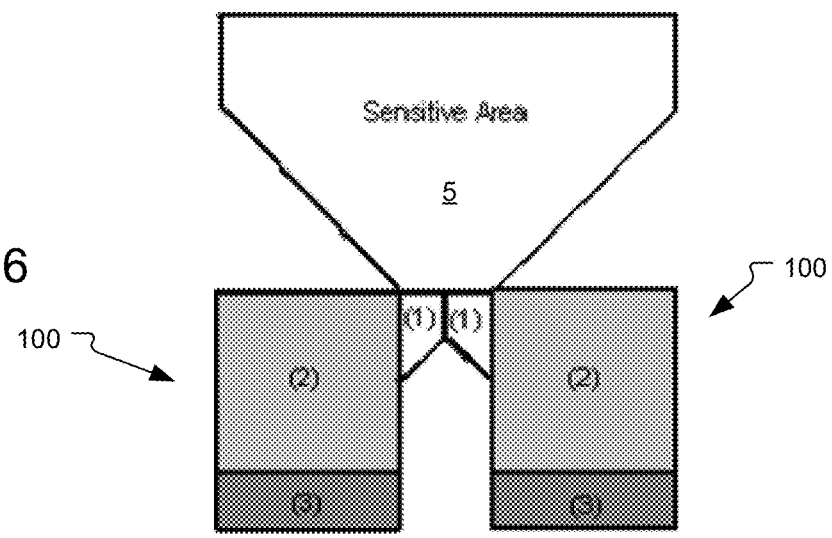
FIGS. 6 and 7 are a top plan views showing the static drift field pixel with the gate/diffusion charge-storage structure.
Figure 7:
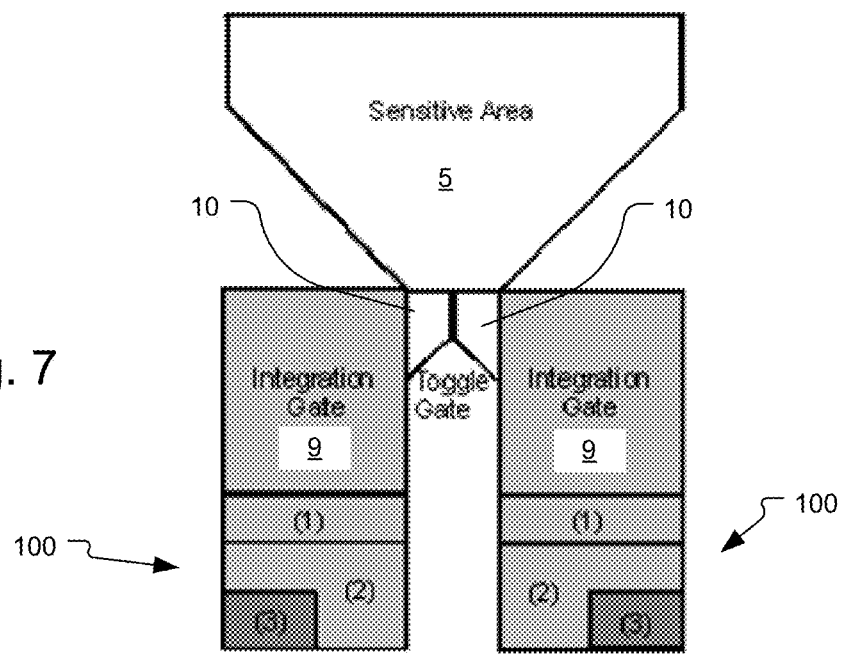

FIG. 6 and FIG. 7 show the drift field pixel as introduced in U.S. Patent Application Publication No. US 2008/0239466 A1, which is incorporated herein in its entirely by this reference, and supplemented with the charge storage structure 100.

In more detail, concerning FIG. 6, a static drift field is generated in the sensitive area 5. Photo generated charges such as electrons are moved in the direction of the two barrier gates 1. The barrier gates operate in an alternating fashion so that the photogenerated charges are directed into either the left or the right integration gates 2. In the example of a time of flight sensor, the photogenerated charges are stored to either the left or right integration gates synchronously with the modulation of the light that illuminates the scene of interest.

In FIG. 7, the photosensitive area 5 moves the photo generated charges in the direction of either left and right toggle gate 10. These toggle gates 10 direct the photogenerated charges to either the left or right temporary integration gates 9. The temporary integration gates 9 temporarily accumulate the photogenerated charges until they are moved into the integration gates 2 via the barrier gates 1.

In both examples, the photogenerated charges are then read out via the sense node.

Figure 8:
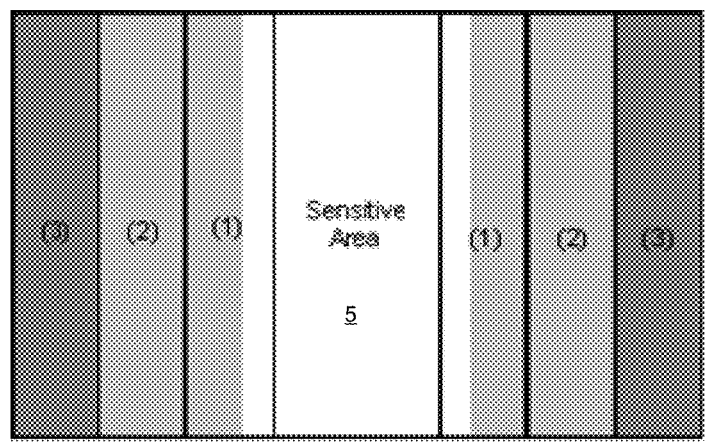
FIG. 8 and FIG. 9 show different embodiments of the invention applied to demodulation pixel structures.
Figure 9:
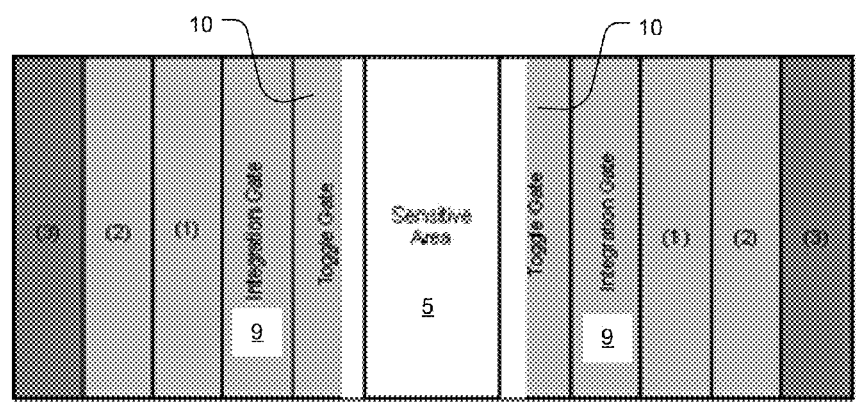
Figure 10:
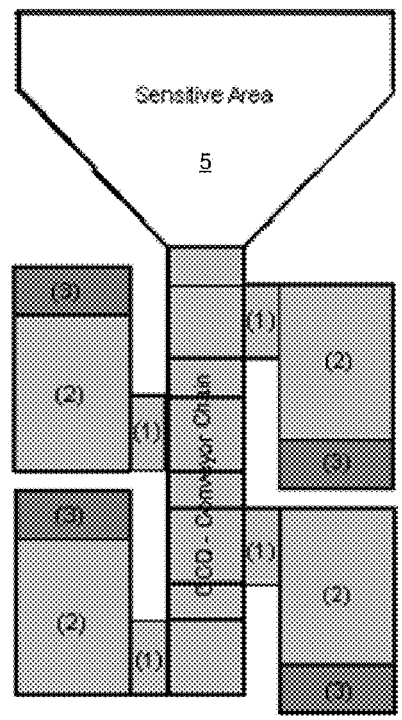
FIG. 10 is a top plan view of a drift field pixel based on the CCD conveyor structure with gate/diffusion charge-storage structure.

FIG. 8 and FIG. 9 show different embodiments of the invention applied to demodulation pixel structures as described in [Ogg03A], [LAN99A], [SPI95B]. The barrier (1) in FIG. 8 or the toggle gates 10 in FIG. 9 are partly photo-sensitive to increase the sensitivity in one embodiment. In FIG. 10, the invention is sketched in combination with the so-called conveyor pixel described in US 2010/0053405 A1, which is incorporated herein in its entirely by this reference.

FIG. 10 shows the embodiment of the invention in combination with the daisy chain charge storage as described in WO 2010/025331 A1. The different barrier gates 1, are connected to the conveyor chain moving the charges to the different storage sites. The storage sites then include the invented gate/diffusion charge-storage structures as described in FIG. 1.

The invention is also applicable in the field of 2D imagers. The invention brings up the same advantages as in 3D applications, which is mainly the significant increase of the pixel's fill factor and/or the pixel's charge storage ability. This type of pixel finds its field of application for example in global shutter pixels.

The presented storage structure uses a combination of a gate and a diffusion capacitance in order to increase the integration gate's overall capacitance. This allows a reduction of the integration gate area and/or sense node area in favor of a significant increase of the pixels' full well. The stable voltage at the storage gate protects the remaining part of floating diffusion more against interfering signals when the signals lines next to the storage area have high frequency components. A minimal sized diffusion capacitance helps to minimize the noise level.

The implementation of the presented structure is preferably processed in technology that provides charge coupled gate structures as well as a high integration density. These types of CCD/CMOS-processes find their field of application mainly in 3D time-of-flight imagers. However, it is also imaginable to use pure CCD or pure CMOS processes.

While this invention has been particularly shown and described with references to preferred embodiments thereof, it will be understood by those skilled in the art that various changes in form and details may be made therein without departing from the scope of the invention encompassed by the appended claims.

[BUE04A] B. Büttgen, "Large-area pixel for use in an image sensor", European Patent Application, Publication date: Feb. 8, 2006, EP 1 624 490 A1.

[BUE04B] B. Büttgen et al, "Demonstration of a novel drift field pixel structure for the demodulation of modulated light waves with application in three-dimensional image capture", Proc. Of the SPIE, vol. 5302, pp. 9-20, April 2004.

[BUE05A] B. Büttgen, "Device and method for the demodulation of modulated electromagnetic wave fields", International Publication date: Apr. 26, 2007, WO2007/045108A1.

[BUE05B] Bernhard Büttgen, Thierry Oggier, Michael Lehmann, Rolf Kaufmann, Felix Lustenberger, "CCD/CMOS Lock-In Pixel for Range Imaging: Challenges, Limitations and State-of-the-Art", 1st range imaging research day, Eidgenössische Technische Hochschule Zürich, 2005.

[LEH08A] Michael Lehmann, Bernhard Büttgen, "Demodulation Pixel with Daisy Chain Charge Storage Sites and Method of Operation Therefor," U.S. Published Patent Application No. 2010/0053405 filed on Aug. 28, 2009.

[SUA08A] Suat U. "Ay, A Hybrid CMOS APS Pixel for Wide-Dynamic Range Imaging Applications", IEEE Publication, 2008.

[GOK04A] Gokturk et al, "A Time-Of-Flight Depth Sensor—System Description, Issues and Solutions", CVPR 04, Vol.3, p.35

[HAG08A] Hagebeuker, "Mehrdimensionale Objekterfassung mittels PMD Sensorik", Optik & Photonik, March 2008

[KAW06A] T. Ushinaga et al., "A QVGA size CMOS time-of-flight range image sensor with background light charge draining structure", Three-dimensional image capture and applications VII, Proceedings of SPIE, Vol. 6056, pp. 34-41, 2006.

[KAW07A] Kawahito et al, "A CMOS time-of-flight range image sensor with gates-on-field-oxide structure"; IEEE Sensors Journal, Vol. 7, No. 12, Dec. 2007

[SPI99A] T. Spirig, "Apparatus and method for detection of an intensity-modulated radiation field", Jan. 5, 1999, U.S. Pat. No. 5,856,667.

[SPI95B] T. Spirig et al., "The lock-in CCD—Two-dimensional synchronous detection of light", IEEE; Journal of quantum electronics, Vol. 31, 1995.

[SCH98A] R. Schwarte, "Verfahren and Vorrichtung zur Bestimmung der Phasen-und/oder Amplitudeninformation einer elektromagnetischen Welle", Mar. 12, 1998, DE 197 04 496 A1.

[SEI02A] P. Seitz, "Four-tap demodulation pixel", Date of filing: Jun. 20, 2002, GB 2 389 960 A.

[NIE05A] D. van Nieuwenhove et al., "Novel Standard CMOS Detector using Majority Current for guiding Photo-Generated Electrons towards Detecting Junctions", Proceedings Symposium IEEE/LEOS Benelux Chapter, 2005.

[Ogg03A] T. Oggier et al., "An all solid-state optical range camera for 3D real-time imaging with sub-centimeter resolution (SwissRanger™)", Proc. SPIE Vol. 5249 No. 65, 2003.

[LAN99A] R- Lange et al., "Time-of-flight range imaging with custom solid-state image sensor", Proc. SPIE Vol. 3823, 1999.

[SCH97A] R. Schwarte et al., T. Ringbeck et al., "A new electrooptical mixing and correlating sensor: Facilities and Applications of the Photonic Mixer Device (PMD)", Proc. SPIE Vol. 3100, pp 245, 1997.

[MOE05A] T. Moeller et al., "Robust 3D Measurement with PMD Sensors", $1^{st}$ range imaging research day, Eidgenössische Technische Hochschule Zürich, 2005.

What is claimed is:

1. A pixel comprising:
   a substrate;
   a photosensitive area in the substrate that converts light into photogenerated charges;
   a storage structure, comprising an integration gate and a diffusion capacitance, that stores the photogenerated charges, wherein the diffusion capacitance functions as a sense node, and wherein the diffusion capacitance is embedded in the integration gate;
   an amplifier for reading out photogenerated charges via the sense node; and
   a barrier gate which separates the photogenerated charges in the integration gate and the diffusion capacitance from the photosensitive area, wherein photogenerated charges are transferred to the storage structure by flowing over the barrier gate and into the integration gate and the diffusion capacitance.

2. A pixel as claimed in claim 1, wherein during reset phase a potential is generated in a substrate below the integration gate that is higher than a potential below the sense node.

3. A pixel as claimed in claim 2, wherein the higher potential below the integration gate is filled with the photogenerated charges to a reset voltage potential from a reset node for the sense node.

4. A pixel as claimed in claim 1, wherein the diffusion capacitance is embedded in a middle of the integration gate.

5. A pixel as claimed in claim 1, further comprising a temporary integration gate that temporarily accumulates the photogenerated charges from the photosensitive area until the photogenerated charges are moved into the storage structure via the barrier gate.

6. A method of operation of a pixel, the method comprising:
   converting light into photogenerated charges in a photosensitive area;
   flowing the photogenerated charges from the photosensitive area over a barrier gate and into a storage structure comprising an integration gate and a diffusion capacitance, wherein the diffusion capacitance is embedded in the integration gate;
   storing the photogenerated charges in the storage structure; and
   reading out photogenerated charges from the diffusion capacitance which functions as a sense node.

7. A method as claimed in claim 6, further comprising generating a potential during reset phase in a substrate below the integration gate that is higher than a potential below the sense node.

8. A method as claimed in claim 7, further comprising filling the higher potential below the integration gate with the photogenerated charges to a reset voltage potential from a reset node for the sense node.

9. A method as claimed in claim 6, further comprising temporarily storing the photogenerated charges from the photosensitive area in a temporary integration gate until the photogenerated charges are moved into the storage structure via the barrier gate.

* * * * *